United States Patent
Nagaoka et al.

[11] Patent Number: 6,075,414
[45] Date of Patent: Jun. 13, 2000

[54] HIGH FREQUENCY AMPLIFIER HAVING A VARIABLE ATTENUATOR CONNECTED TO THE BASE OF AN AMPLIFIER FET

[75] Inventors: Masami Nagaoka, Ebina; Yoshiko Ikeda, Kawasaki; Toshiki Seshita, Fujisawa; Atsushi Kameyama, Tokyo, all of Japan

[73] Assignee: Kabushiki Kaisha Toshiba, Kawasaki, Japan

[21] Appl. No.: 09/041,765

[22] Filed: Mar. 13, 1998

[30] Foreign Application Priority Data

Mar. 17, 1997 [JP] Japan ..................................... 9-063279

[51] Int. Cl.[7] ....................................................... H03G 3/30
[52] U.S. Cl. .......................... 330/284; 330/145; 330/277; 330/302
[58] Field of Search .................................... 330/284, 145, 330/277, 302

[56] References Cited

U.S. PATENT DOCUMENTS 3,480,873 11/1969 Carter ....................................... 330/277
5,699,017 12/1997 Maejima ................................... 330/284
5,742,206 4/1998 Ishida ......................................... 33/284

OTHER PUBLICATIONS

K. Miyatsuji, et al., A Low–Distortion GaAs Variable Attenuator IC For Digital Mobile Communication System, IEEE International Solid–State Circuits Conference, Feb. 15, 1995.

Masayuki Kimishima, et al., 1.9GHz Band Variable Gain Linear Amplifier MMIC, Lecture Paper C–83 of 1996 National Meeting of the Institue of Electronics, Information & Communications Engineers of Japan, Mar. 28, 1996.

*Primary Examiner*—Michael B Shingleton
*Attorney, Agent, or Firm*—Oblon, Spivak, McClelland, Maier & Neustadt, P.C.

[57] ABSTRACT

The invention provides a high frequency amplifier in which a variable attenuator consisting of a bypass FET, which has a drain connected to a first-stage amplifying FET via a resistor, and a source grounded via a capacitor, is located on a main signal line leading to the gate of the amplifying FET, in order to control the gate potential of a bypass FET using a gain control voltage source, thereby varying the gain of the amplifier.

21 Claims, 6 Drawing Sheets

| Vg (V) | Vgs 14 (V) | Vgs 18 (V) | MAG (dB) |
|---|---|---|---|
| -0.1 | 0.1 | -0.1 | 21 |
| 0 | 0 | 0 | 24 |
| 0.1 | -0.1 | 0.1 | 26 |
| 0.2 | -0.2 | 0.2 | 27 |
| 0.3 | -0.3 | 0.3 | 28 |
FIG. 10
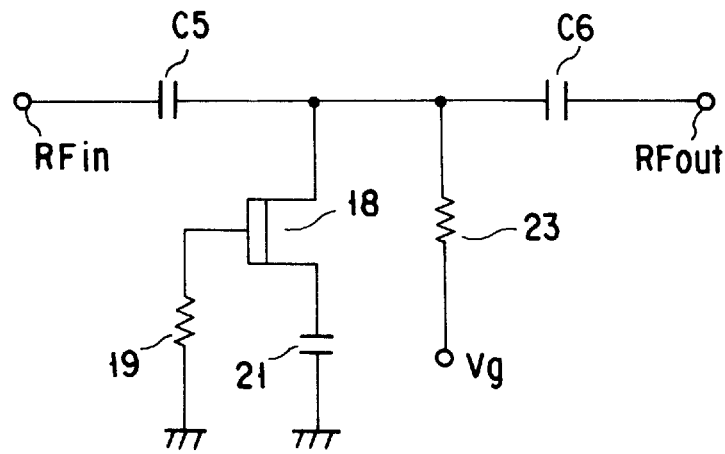
FIG. 11
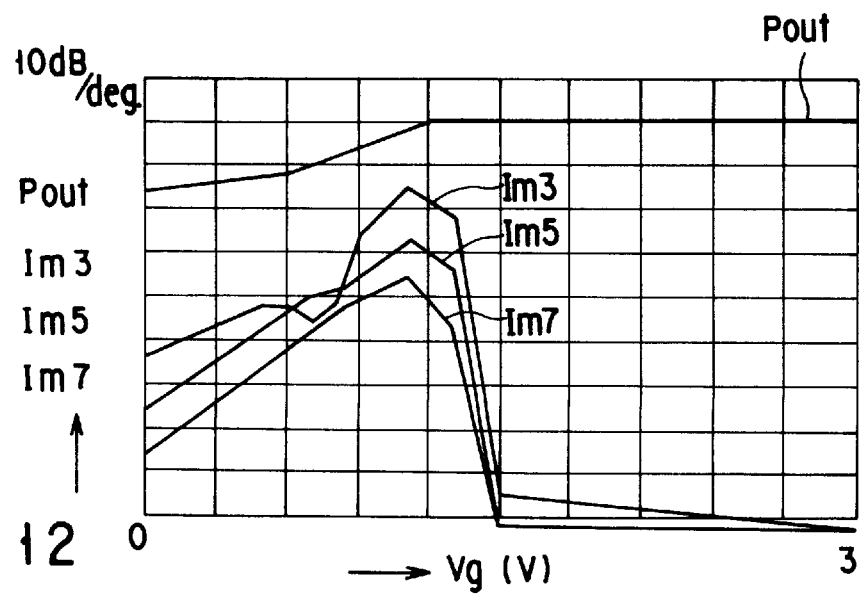
FIG. 12

HIGH FREQUENCY AMPLIFIER HAVING A VARIABLE ATTENUATOR CONNECTED TO THE BASE OF AN AMPLIFIER FET

BACKGROUND OF THE INVENTION

This invention relates to a high frequency amplifier for a very high frequency band such as GHz, and more particularly, to a high frequency amplifier with a gain varying function.

With an increase in demand for mobile communication, there is a strong demand for a reduction in the size and cost of cellular phones and other type mobile communication apparatuses. To meet the request, research has been made into integrating as many functions as possible in high frequency circuits, such as high frequency amplifiers, incorporated in mobile communication apparatuses, to decrease the number of chips used in the apparatuses.

In general, high frequency amplifiers have different gains due to differences in characteristics therebetween or changes in temperature. Further, modulators, for example, which are each located on the signal source side of the high frequency amplifier, have different output amplitudes. To deal with the gain variations of high frequency amplifiers or the amplitude variations of input signals, a gain varying function is provided in many high frequency amplifiers by incorporating therein a variable gain amplifier or a variable attenuator.

To impart a gain varying function to a high frequency amplifier, it is required, particularly in digital mobile communication apparatuses, that the linear characteristic of the amplifier be prevented from a great change even when its gain is varied, in order to maintain the output of the amplifier at a value suitable for the specifications of the apparatus.

To realize the gain varying function of the high frequency amplifier, several methods are proposed.

The first one is to use a variable gain amplifier constituted of two FETs connected in cascade, or of a dual gate FET.

FIG. 1 shows an example of the former. As is shown in FIG. 1, FETs Q11 and Q12 are cascade-connected. Specifically, the gate of the FET Q11 is connected to a high frequency input terminal RFin, and the drain of the FET Q12 to a high frequency output terminal RFout.

The gate of the FET Q11 is connected to a gate bias power Vg via a resistor R11, and the gate of the FET Q12 to a gain control power Vc via a resistor R12.

Although the variable gain amplifier can be varied in gain by controlling the voltage of the gain control power Vc, it does not have an excellent linear characteristic.

More specifically, if cascade-connected FETs or dual gate FETs are used in cellular phones, whose power voltage has been reduced so far and which is now demanded to operate at a low power of, for example, 3 V or less, it is difficult to obtain the drain-source voltage Vds of each FET at a sufficient value since the two FETs are connected substantially in series to the power voltage. As a result, the output waveform of the structure is principally liable to be distorted.

Thus, it is difficult in the conventional art to satisfy the linear characteristic demanded in a digital mobile communication apparatus whose power voltage has been more and more reduced.

The second method for imparting a gain varying function to the high frequency amplifier is to cause a high frequency signal to bypass, using a variable attenuator which includes FETs.

FIG. 2 shows an example of the attenuator. As is shown in FIG. 2, a bypass FET Q21 has a drain connected to a main signal line between a high frequency input terminal RFin and a high frequency output terminal RFout, and a source connected to a bias power Vd and grounded via a capacitor C21.

Moreover, a resistor 21 is connected between the drain and source of the FET Q21, and a gain control power Vg is connected to the gate of the FET Q21 via a resistor R22.

Since in the above structure, the amount of bypass can be varied by varying the voltage of the gain control power Vg (i.e. the gate potential of the FET Q21), thereby varying the drain-source resistance of the FET Q21, the attenuation amount between the high frequency input and output terminals RFin and RFout can be varied.

The variable attenuator is located between an amplifying element and an output matching circuit, which are incorporated in the high frequency amplifier, or between stages of a multi-stage amplifier. In this structure, however, a signal which is amplified by the amplifying element and hence has a large voltage amplitude is made to bypass. Therefore, the output is liable to be distorted because of the non-linear characteristic of the bias FET Q21. Furthermore, when the amount of attenuation is large, the impedance of the bypass FET Q21 which is viewed from the drain side is low, and hence the load line of the amplifying element sharply inclines as compared with a case where the attenuation amount is small. Accordingly, the output is often distorted depending upon current level.

In addition, a variable attenuator suitable for varying the gain of a high frequency amplifier is also proposed in the form of a structure in which a first FET is connected parallel to the input/output terminal side resistance of a T-type attenuator or a π-type attenuator, and a second FET is connected in series to the ground side resistance of it, the attenuation amount being changed with a predetermined impedance kept, by complementarily turning on and off the first and second FETS.

This type attenuator, however, requires a great number of elements and a control circuit for performing on/off control of a plurality of FETs. Accordingly, the overall circuit is inevitably complicated, with the result that the chip area of each product increases or the product yield decreases.

On the other hand, to reduce the chip area, an element formed by a special process, such as an Octal gate FET or a BST capacitor, must be employed, as is known from the T-type attenuator described in Miyatuji.k., and Ueda,D., "A Low Distortion GaAs Variable Attenuator IC for Digital Mobile Communication System", JSSCC Digest. pp. 42–43, February, 1995.

As described above, if in the prior art, a gain varying function is imparted to a high frequency amplifier, the linear characteristic of the amplifier may degrade, or the circuit structure complicate.

BRIEF SUMMARY OF THE INVENTION

It is the object of the invention to provide a high frequency amplifier with a gain varying function, an excellent linear characteristic and a simple structure.

According to a first aspect of the invention, there is provided a high frequency amplifier comprising:
- an amplifying FET for amplifying a high frequency signal; and
- a variable attenuator connected parallel to the amplifying FET for controlling the amplification factor of the amplifying FET.

According to a second aspect of the invention, there is provided a high frequency amplifier similar to the amplifier of the first aspect, except that the attenuator includes:

a bypass FET having a drain connected to the gate of the amplifying FET and a source connected to a point of a predetermined potential; and control means for controlling the gate potential of the bypass FET.

According to a third aspect of the invention, there is provided a high frequency amplifier similar to the amplifier of the second aspect, except that it further comprises a capacitor having an end connected to the drain of the bypass FET and the other end connected to the gate of the amplifying FET.

According to a fourth aspect of the invention, there is provided a high frequency amplifier similar to the amplifier of the second aspect, except that it further comprises an impedance element having an end connected to the source of the bypass FET and the other end connected to the point of the predetermined potential.

According to a fifth aspect of the invention, there is provided a high frequency amplifier similar to the amplifier of the second aspect, except that it further comprises an impedance element having an end connected to the gate of the amplifying FET and the other end connected to the point of the predetermined potential.

According to a sixth aspect of the invention, there is provided a high frequency amplifier similar to the amplifier of the second aspect, except that it further comprises an impedance element having an end connected to the drain of the amplifying FET and the other end connected to a bias power.

According to a seventh aspect of the invention, there is provided a high frequency amplifier similar to the amplifier of the second aspect, except that it further comprises an input matching circuit interposed between an input terminal for inputting the high frequency signal and the gate of the amplifying FET, such that the input matching circuit opens in a DC manner when viewed from an output side.

According to an eighth aspect of the invention, there is provided a high frequency amplifier similar to the amplifier of the seventh aspect, except that it further comprises a resistor interposed between the input matching circuit and the drain of the bypass FET.

According to a ninth aspect of the invention, there is provided a high frequency amplifier similar to the amplifier of the first aspect, except that the attenuator includes:

a bypass FET having a drain connected to the gate of the amplifying FET and a source connected to a point of a predetermined potential; and control means for controlling the gate potential of the amplifying FET and the drain-source voltage of the bypass FET.

According to a tenth aspect of the invention, there is provided a high frequency amplifier similar to the amplifier of the ninth aspect, except that it further comprises an impedance element having an end connected to the source of the bypass FET and the other end connected to the point of the predetermined potential.

According to an eleventh aspect of the invention, there is provided a high frequency amplifier similar to the amplifier of the ninth aspect, except that it further comprises an impedance element having an end connected to the gate of the amplifying FET and the other end connected to the control means.

According to a twelfth aspect of the invention, there is provided a high frequency amplifier similar to the amplifier of the ninth aspect, except that it further comprises an impedance element having an end connected to the drain of the amplifying FET and the other end connected to a bias power.

According to a thirteenth aspect of the invention, there is provided a high frequency amplifier similar to the amplifier of the ninth aspect, except that it further comprises an input matching circuit interposed between an input terminal for inputting the high frequency signal and the gate of the amplifying FET, such that the input matching circuit opens in a DC manner when viewed from an output side.

According to a fourteenth aspect of the invention, there is provided a high frequency amplifier similar to the amplifier of the thirteenth aspect, except that it further comprises a resistor interposed between the input matching circuit and the drain of the bypass FET.

According to a fifteenth aspect of the invention, there is provided a high frequency amplifier similar to the amplifier of the ninth aspect, except that it further comprises a circuit connected to the source of the amplifying FET and consisting of a capacitor and a resistor which are connected in parallel to each other.

According to a sixteenth aspect of the invention, there is provided a high frequency amplifier similar to the amplifier of the ninth aspect, except that FETs connected in cascade are used in place of the bypass FET.

According to a seventeenth aspect of the invention, there is provided a high frequency amplifier similar to the amplifier of the ninth aspect, except that the control means includes:

voltage supply means for supplying a voltage for controlling the gate potential of the amplifying FET; and resistors for dividing a voltage supplied from the voltage supply means.

Since in the above-described high frequency amplifier, the bypass FET is connected to that input-side of the first-stage amplifying FET, at which a high frequency signal has a large voltage amplitude, distortion due to the non-linear characteristic of the bypass FET will not easily occur in the high frequency signal, which means that the high frequency amplifier can have an excellent linear characteristic.

Further, since the attenuator has a simple structure which includes the bypass BET and peripheral bias circuits, it is suitable for an MIC (microwave integrated circuit) or an MMIC (monolithic microwave integrated circuit), requires only a small chip area, and enables a high product yield.

In high frequency amplifiers of this kind, in general, an intermodulation distortion component due to the non-linear characteristic of the amplifying FET mixes with the high frequency signal output and acts as low frequency noise. The low frequency noise itself will not raise a problem. However, if it leaks into the main signal line from the bias power via the drain of the bypass FET, a beat will occur between the noise and the carrier component of the high frequency signal, whereby the difference frequency component therebetween appears in the vicinity of the carrier frequency component and is amplified by the amplifying FET, together with the high frequency signal component. As a result, the specified leakage power between adjacent channels, for example, will not be satisfied.

On the other hand, where, for example, a resistor or a high resistance as an impedance element is interposed between the source of the bypass FET and the bias power, the low frequency noise mixed with the high frequency signal output and having leaked into the bias power is absorbed in the bias power by virtue of the impedance element. Thus, the noise is prevented from leaking into the main signal line via the bypass FET.

As described above, occurrence of a beat between the low frequency noise and the carrier frequency component is prevented, and hence an increase in the leakage power between adjacent channels is avoided.

In another aspect of the invention, control means is provided for simultaneously controlling the gate potential of the first-stage amplifying FET and the drain or gate potential of the bypass FET.

In this case, the bypass amount (attenuation amount) of the bypass FET and the gain of the amplifying FET are simultaneously varied to control the gain of the high frequency amplifier. Therefore, degradation of the linear characteristic of the amplifier in relation to changes in its gain is further reduced.

Moreover, this structure can reduce, during attenuation by the bypass FET, the current flowing between the gate and the source of the amplifying FET and hence the power consumption of same by reducing the gate-source voltage of the same.

In the high frequency amplifier of the invention, it is preferable to interpose an input matching circuit between the input terminal for inputting the high frequency signal and the gate of the amplifying FET, such that the input matching circuit is opened in a DC manner when viewed from the output side.

It is also preferable to interpose a resistor with a relatively high resistance between the output side of the input matching circuit and the drain of the bypass FET.

By virtue of this structure, that change in the input impedance of the high frequency amplifier, which depends upon a change in the bypass amount of the bypass FET, can be kept small, thereby keeping the input VSWR at an excellent value of, for example, less than two, irrespective of the gain of the high frequency amplifier. This advantage can be also obtained by setting the loss of the input matching circuit at a high value.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 10 is a view, showing characteristics of an amplifying FET and a bypass FET;

FIG. 11 is a circuit diagram, showing a high frequency amplifier used for simulations;

FIG. 12 is a graph, showing the dependency, upon a gain control voltage, of the output of an amplifying FET and the intermodulation distortion in the high frequency amplifier of FIG. 11;

DETAILED DESCRIPTION OF THE INVENTION

The embodiments of the invention will be described with reference to the accompanying drawings.

First Embodiment

Figure 3:
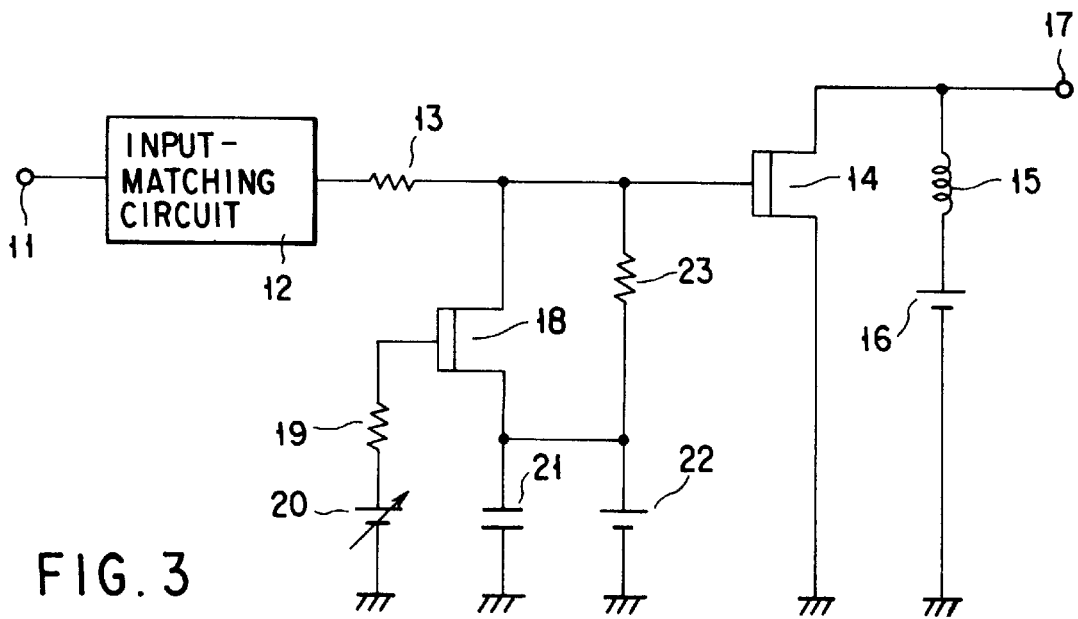
FIG. 3 is a circuit diagram, showing a high frequency amplifier according to a first embodiment of the invention.

FIG. 3 shows a high frequency amplifier according to a first embodiment of the invention.

As is shown in FIG. 3, a GHz-band high frequency signal via, for example, a transmission line with a characteristic impedance of 50 Ω is input at a high frequency input terminal 11. The high frequency input terminal 11 is connected to the input-side of an input-matching circuit 12, and the output-side of the circuit 12 is connected, via a resistor 13, to the gate of a first FET (hereinafter referred to as an "amplifying FET") 14 as a first-stage amplifying element.

The amplifying FET 14 is constituted of, for example, a GaAs MESFET with a threshold voltage of about −0.3 V and a gate width of 200 μm. The drain of the amplifying FET 14 is connected to a drain bias power 16 via an inductor 15, and also to a high frequency output terminal 17. In place of the inductor 15, any other appropriate impedance element such as a distributed constant line may be used.

The high frequency amplifier of the embodiment may consist of a single-stage amplifier or a multi-stage amplifier. In the case of the single-stage amplifier, the high frequency output terminal 17 is the last output terminal. On the other hand, in the case of the multi-stage amplifier, the high frequency output terminal 17 is connected to the gate of the next-stage FET via a DC interrupting capacitor (not shown).

The gate of the amplifying FET 14 is connected to the drain of a bypass FET 18 which constitutes a variable attenuator. The bypass FET 18 is constituted of, for example, a GaAs MESFET with a threshold voltage of about −1 V and a gate width of 200 μm.

The gate of the bypass FET 18 is connected to a gain control voltage source 20 via a resistor 19 of about 3k–20k Ω. The source of the FET 18 is grounded via a capacitor 21 of several tens—several hundreds pF.

Another bias power 22 is a common bias power for applying a bias to both the gate of the amplifying FET 14 and the source of the bypass FET 18, and is connected to the source of the FET 18 directly and to the gate of the FET 14 via a resistor 23 of several tens Ω–several kΩ.

The resistor 23 serves to keep the drain and the source of the bypass FET 18 at the same potential. In place of the resistor 23, an inductor with a high impedance or a distributed constant line may be used. In other words, it suffices if the element can connect the gate of the amplifying FET 14 to the drain of the bypass FET 18 in view of direct current.

Figure 4A:
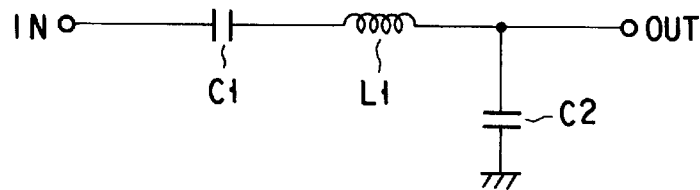
FIGS. 4A and 4B are circuit diagrams, showing input-matching circuits.
Figure 4B:
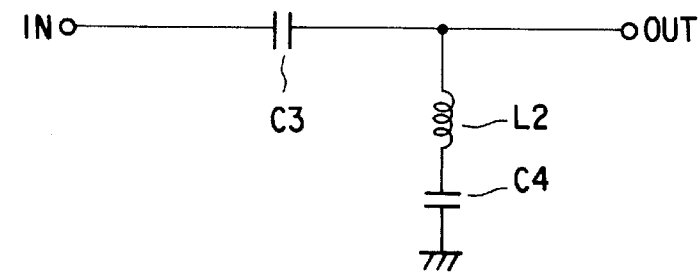

The input-matching circuit 12 has a structure shown in FIGS. 4A or 4B. In the FIG. 4A case, a capacitor C1 and an inductor L1 are connected in series between input and output terminals.

In the FIG. 4B case, a capacitor C3 is connected between input and output terminals, and an inductor L2 and a capacitor C4 are connected in series between the output terminal and the ground terminal.

The amplifying FET 14 is stabilized mainly by the resistors 13 and 23 and the bypass FET 18. The resistor 13 also has a function for suppressing the change in the impedance of the high frequency amplifier which will occur when the gain is changed. The resistance of the resistor 13 is determined in light of this function.

Since, however, the gain of the amplifier will degrade when the resistance of the resistor 13 is extremely high, the resistance should be set at about 50–200 Ω. The resistor 13 can be omitted if the input-matching circuit 12 is made to have a high loss. The same can be said of the other embodiments described below.

In the high frequency amplifier of the embodiment, the drain-source resistance of the bypass FET 18 can be varied by varying the voltage of the gain control voltage source 20.

As a result, the amount of a high frequency signal caused to bypass by the FET 18, i.e. the attenuation amount of the attenuator, varies, and hence the gain of the high frequency amplifier 14 varies. Specifically, a gain change of 10–15 dB occurred when the voltage of the gain control voltage source 20 was varied within a range of 0–3 V. Moreover, the input VSWR of the high frequency amplifier showed an appropriate value of 2 or less in the overall voltage variable range.

Moreover, the linear characteristic of the high frequency amplifier is excellent, since in the amplifier, the variable attenuator consisting of the bypass FET 18 is located on the input-side of the amplifying FET 14 as a first-stage amplifying element, i.e. in a position in which the high frequency signal has a small voltage amplitude.

Specifically, the fifth-order and seventh-order intermodulation distortion components occurring when two waves were input to the high frequency input terminal 11 had values of −45 dBc or less and −70 dBc or less, respectively, in the overall gain variable range.

Then, using, as a comparative example, a multi-stage high frequency amplifier in which a bypass FET is connected to a main signal line between a first-stage amplifying FET and a second-stage amplifying FET, similar characteristics were examined by inputting two waves to the amplifier. As a result, the third-order and seventh-order distortion components had values of −37 dBc or less and −53 dBc or less, respectively.

From the above examination results, it is understood that the high frequency amplifier of the embodiment is superior in linear characteristic to the conventional one which has a bypass FET with a gain varying function.

Furthermore, since the variable attenuator of the embodiment has a simple structure which comprises the bypass FET 18 and peripheral bias circuits, it is suitable for the MIC and MMIC, requires a small chip area, and enables a high product yield.

Since in the high frequency amplifier of the embodiment, the gain variable element of the variable attenuator is formed only of the bypass FET 18, and hence the gain control is performed by varying the voltage of the gain control voltage source 20, the control circuit for gain control can be made simple in structure.

Figure 1:
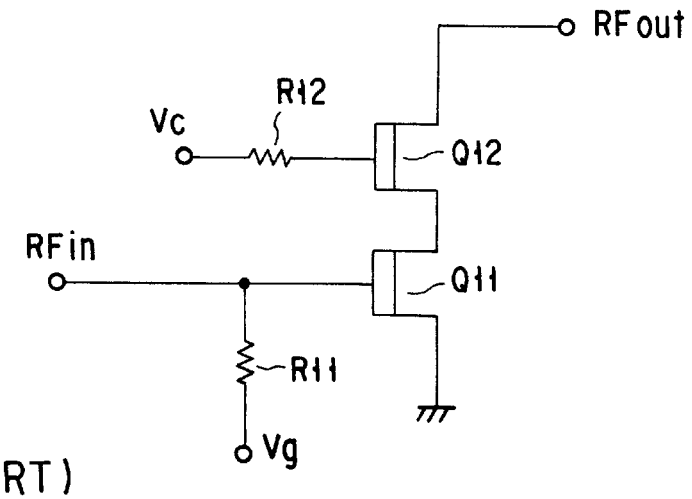
FIG. 1 is a circuit diagram, showing a conventional variable gain amplifier.
Figure 2:
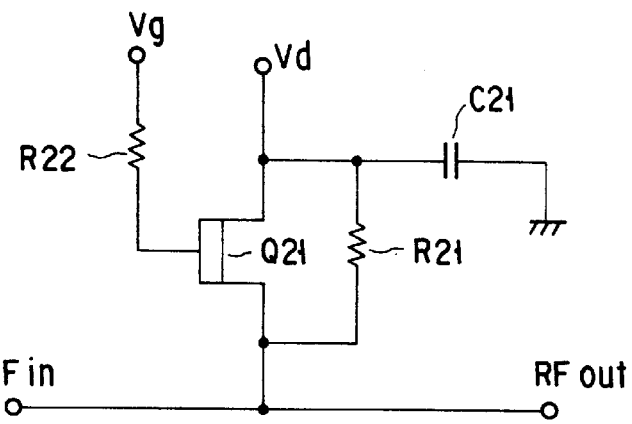
FIG. 2 is a circuit diagram, showing a conventional attenuator.

The other embodiments of the invention will now be described. In these embodiments, elements similar to those in FIG. 1 are denoted by corresponding reference numerals, and explanations will be given of different elements only.

Second Embodiment

Figure 5:
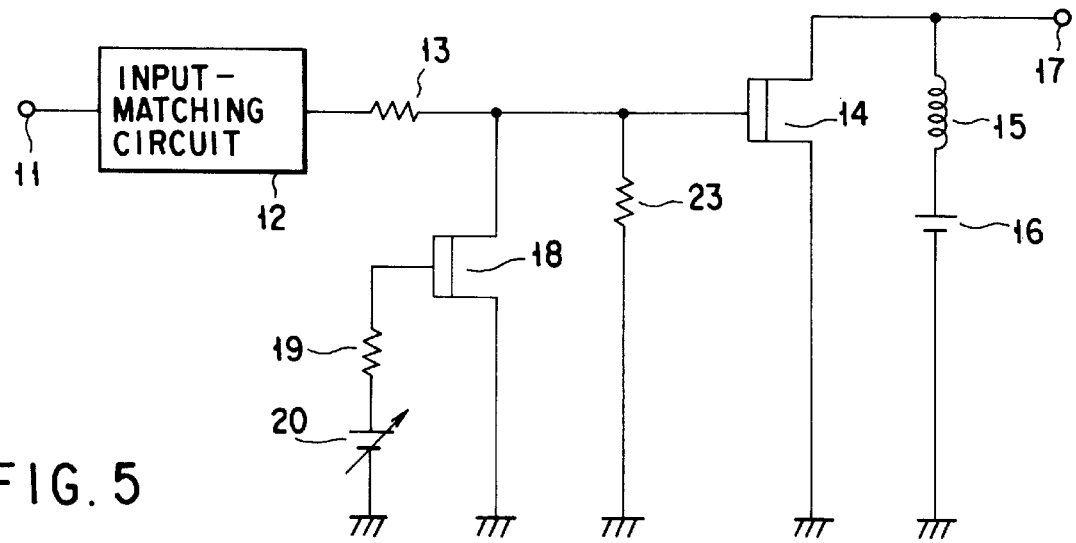
FIG. 5 is a circuit diagram, showing a high frequency amplifier according to a second embodiment of the invention.

FIG. 5 shows a high frequency amplifier according to a second embodiment of the invention.

As is shown in FIG. 5, the source of the bypass FET 18 is directly grounded, without the capacitor 21 used in FIG. 3, and the end of the resistor 23 remote from the gate of the amplifying FET 14 is directly grounded, without the power 22 used in FIG. 3.

This structure can provide basically the same advantage as the first embodiment.

Third Embodiment

Figure 6:
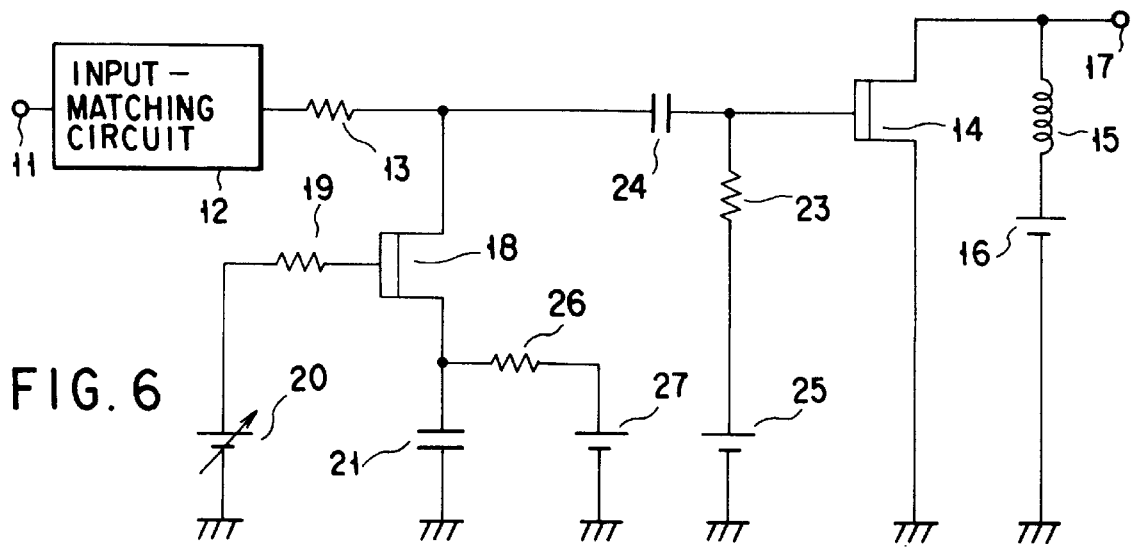
FIG. 6 is a circuit diagram, showing a high frequency amplifier according to a third embodiment of the invention.

FIG. 6 shows a high frequency amplifier according to a third embodiment of the invention.

In this embodiment, the gate of the amplifying FET 14 is connected to the drain of the bypass FET 18 via a capacitor 24 which is connected in series therebetween and located on the main signal line. Further, the gate of the amplifying FET 14 is connected to a gate bias power 25 via the resistor 23. The source of the bypass FET 18 is connected to a source bias power 27 via a resistor 26 of about 3k–20k Ω. The resistor 23 can be replaced with an inductor of a high impedance or with a distributed constant line.

By virtue of the resistor 26, the third embodiment can provide an advantage described below, as well as the same advantage as the first and second embodiments.

In the above-described high frequency amplifiers, in general, an intermodulation distortion component due to the non-linear characteristic of the amplifying FET 14 appears as low frequency noise in a high frequency signal output. Suppose, for example, that a signal with a carrier frequency of 1.9 Hz is input, as a high frequency signal input, to the high frequency input terminal 11. When in this case, low frequency noise enters the main signal line from the drain of the bypass FET 18 via the power circuit of the powers 16 and 27 in FIG. 6, a beat occurs between the frequency component of 1.9 Hz and the low frequency noise at the gate of the amplifying FET 14, thereby causing a difference frequency component to appear in the vicinity of the carrier frequency component. The difference frequency component is amplified by the amplifying FET 14, together with the high frequency signal component.

As a result, a leakage power, which does not satisfy the specifications required for a mobile communication apparatus such as a cellular phone, may well occur between adjacent channels.

On the other hand, in the third embodiment, the resistor 26 is interposed between the source of the bypass FET 18 and the bias power 27. When in this case, low frequency noise which appears at the high frequency output terminal 17 is transmitted to the circuit of the power 27 via the circuit of the power 16, it is absorbed by the power 27 after passing the resistor 26, if the resistor 26 has a sufficient high resistance as described above. Thus, the noise is prevented from leaking to the main signal line via the bypass FET 18.

Accordingly, no beats occur between the low frequency noise and the 1.9 GHz carrier frequency component, which means that the amplifier is free from an increase in leakage power between adjacent channels.

This embodiment may be modified such that the gain control voltage source 20 is replaced with a fixed gate bias power, and the source bias power 27 is replaced with a variable voltage source as a gain control voltage source.

Fourth Embodiment

Figure 7:
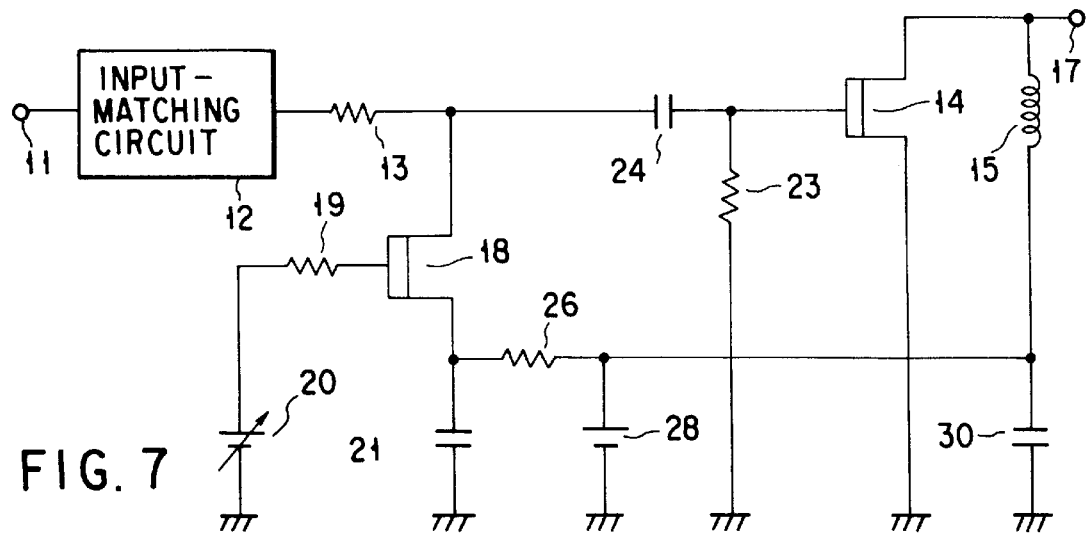
FIG. 7 is a circuit diagram, showing a high frequency amplifier according to a fourth embodiment of the invention.

FIG. 7 shows a high frequency amplifier according to a fourth embodiment of the invention.

This embodiment differs from the FIG. 6 structure in that the drain bias power 16 of the amplifying FET 14 and the source bias power 27 are replaced with a common bias power 28, and also that a capacitor 30 is interposed between the ground terminal and the junction of the inductor 15, the resistor 26 and the common bias power 28. This embodiment can provide the same advantage as the third embodiment.

Fifth Embodiment

Figure 8:
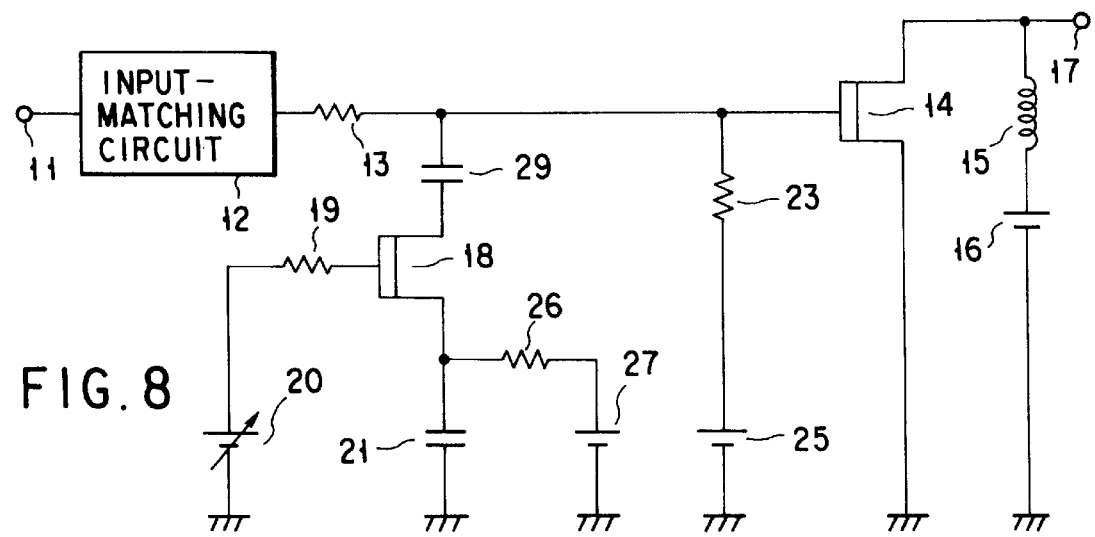
FIG. 8 is a circuit diagram, showing a high frequency amplifier according to a fifth embodiment of the invention.

FIG. 8 shows a high frequency amplifier according to a fifth embodiment of the invention. The fifth embodiment differs from the FIG. 6 structure in that a capacitor 29 interposed between the main signal line and the drain of the bypass FET 18 is used in place of the capacitor 24 located on the main signal line.

This embodiment can also provide the same advantage as the third embodiment. Furthermore, in this embodiment, the bias power 16 and the bias power 27 can be replaced with a common bias power as in the fourth embodiment.

In addition, this embodiment may be modified such that the gain control voltage source 20 is replaced with a fixed gate bias power, and the source bias power 27 is replaced with a variable voltage source as a gain control voltage source.

Sixth Embodiment

Figure 9:
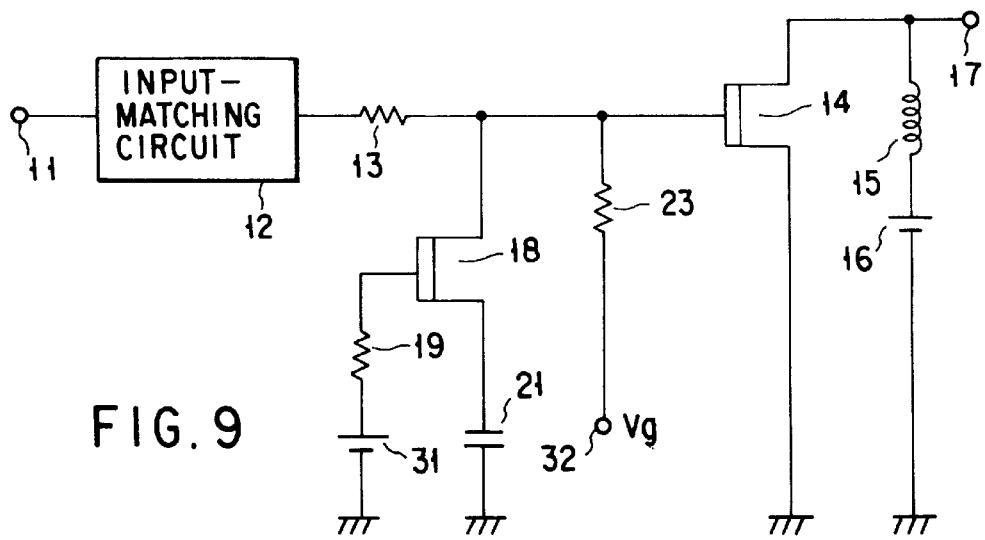
FIG. 9 is a circuit diagram, showing a high frequency amplifier according to a sixth embodiment of the invention.

FIG. 9 shows a high frequency amplifier according to a sixth embodiment of the invention. In this embodiment, the bypass FET 18 has its gate connected to a bias power 31 via the resistor 19, and its source connected to the capacitor 21. Moreover, the end of the resistor 23 remote from the gate of the amplifying FET 14 is connected to a gain control terminal 32 which is supplied with the gain control voltage Vg.

When in this embodiment, the gain control voltage Vg applied to the gain control terminal 32 is varied, the bias conditions of the amplifying FET 18 and the bypass FET 18 simultaneously vary, thereby varying the gain of the high frequency amplifier.

FIG. 10 shows the dependency, upon Vg, of the bias conditions of the amplifying FET 14 and the bypass FET 18 (the gate-source voltages: Vgs14, Vgs18; and the maximum available power of the amplifying FET 14: MAG 14).

In this case, the voltage of the bias power 31 is set at 0 V.

As is evident from FIG. 10, when the gain control voltage Vg applied to the gain control terminal 32 is negative, the On-state resistance (drain-source resistance) of the bypass FET 18 is low and the bypass amount increases, thereby reducing the voltage input to the amplifying FET 14 and increasing the amount of attenuation. At this time, the gate bias of the amplifying FET 14 becomes negative, resulting in reduction of the maximum available power and gain of the FET 14.

As described above, in the high frequency amplifier of the sixth embodiment, the gain of the high frequency amplifier can be controlled by simultaneously varying the attenuation amount by the bypass FET 18 and the gain of the amplifying FET 14 in accordance with a change in the gain control voltage Vg. Accordingly, the degree of degradation in linear characteristic with respect to gain can be further reduced.

The distortion characteristic of the sixth embodiment will now be described.

It is considered that distortion components occurring in the high frequency amplifier of the sixth embodiment are mainly based on distortion components caused by the amplifying FET 14 and the bypass FET 18. However, only a distortion component caused by the bypass FET 18 will now be discussed.

This is because the distortion characteristic of the amplifying FET 14 does not significantly influence the function of the gain control circuit of the invention, and the dependency of the distortion characteristic upon the gate bias relates to the invention. In this embodiment, Vg is designed at a value falling within a range of −0.1–+0.3 V, and the dimensions of the FETs can be designed such that the linear characteristic will not raise any problems when Vg is set at a value within the range.

FIG. 11 shows a variable attenuator portion including the bypass FET 18 in FIG. 10. DC interrupting capacitors C5 and C6 are located on the main signal line between the high frequency input and output terminals RFin and RFout.

FIG. 12 shows the dependency, upon Vg, of the output power Pout to the high frequency output terminal RFout and the third-, fifth-, and seventh-order intermodulation distortion components of Im3, Im5 and Im7, which are obtained when signal simulation is performed by inputting two waves to the variable attenuator shown in FIG. 11.

As is understood from FIG. 12, the linear characteristic significantly degrades in the vicinity of the threshold voltage of the bypass FET 18, i.e. in the vicinity of Vg=1.1 V. Thus, at the time of controlling a gain of about 5 dB, degradation of the linear characteristic is small enough to ignore. When, however, a gain of about 10 dB is controlled, the linear characteristic greatly degrades.

On the other hand, in the sixth embodiment, both the attenuation amount of the bypass FET 18 and the gain of the amplifying FET 14 are simultaneously varied as aforementioned. Therefore, to control a gain of about 10 dB, part of 10 dB is dealt with by the attenuation control of the bypass FET 18, and the other part by the gain control of the amplifying FET 14.

In light of the above, the gain control can be performed without degrading the linear characteristic, by designing such that the amplifier is operable within a range (Vg is less than 0.7 V) in which the bypass FET 18 does not generate distorted signals.

Moreover, the sixth embodiment can provide the advantage that during attenuation, the gate-source voltage Vgs of the amplifying FET 14 decreases, thereby reducing the current flowing therethrough and hence the power consumption thereof. In addition, in this embodiment, the gain control can be performed simply by the bypass FET 18, the capacitor 21 and some resistors, which means that a control circuit for gain control has a simple structure. Accordingly, the high frequency amplifier can be made compact by the MIC and MMIC techniques, as in the above-described embodiment.

Seventh Embodiment

Figure 13:
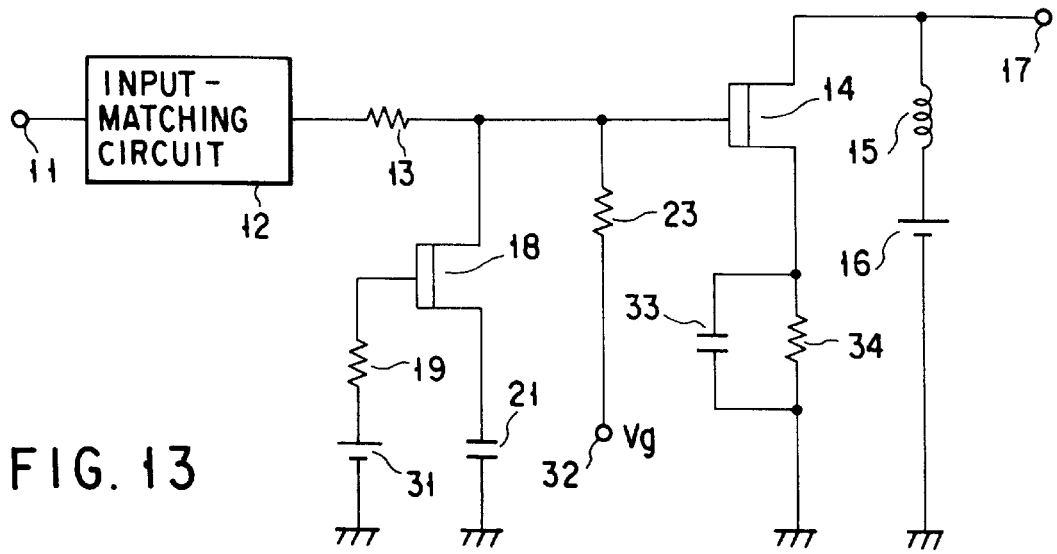
FIG. 13 is a circuit diagram, showing a high frequency amplifier according to a seventh embodiment of the invention.

FIG. 13 shows a high frequency amplifier according to a seventh embodiment of the invention. In this embodiment, a self-bias circuit including a capacitor 33 and a resistor 34 connected parallel to each other is interposed between the source of the amplifying FET 18 and the ground terminal.

Eighth Embodiment

Figure 14:
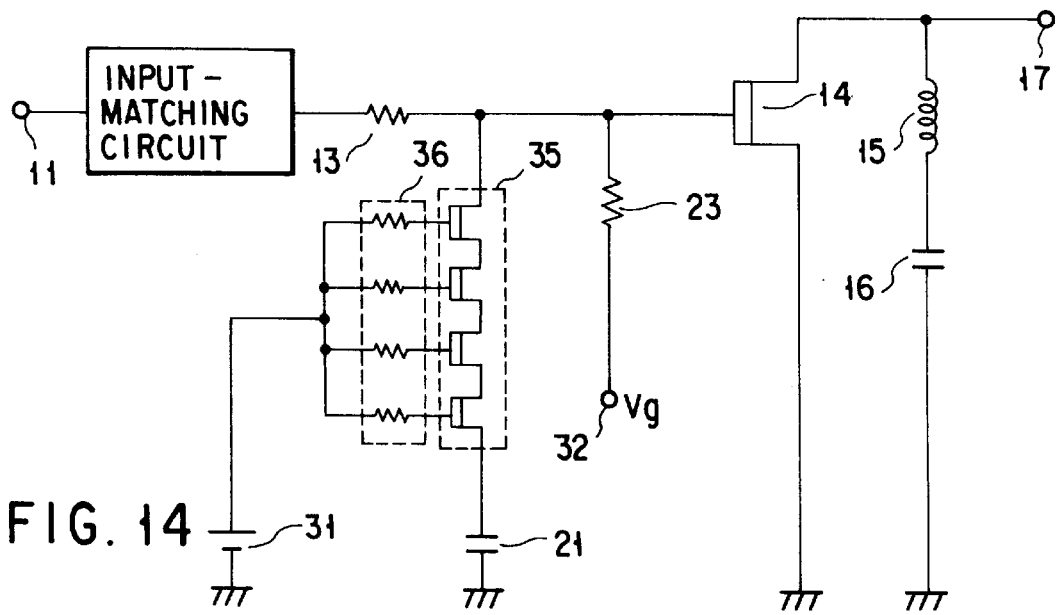
FIG. 14 is a circuit diagram, showing a high frequency amplifier according to an eighth embodiment of the invention.

FIG. 14 shows a high frequency amplifier according to an eighth embodiment of the invention. In this embodiment, a cascade FET group 35 consisting of four FETs connected in cascade is used in place of the bypass FET 18 in FIG. 9, and a resistor 36 is connected between the gate of each FET and a bias power 31.

The cascade-connected bypass FETs enables enhancement of the linear characteristic, increase of the attenuation amount, and input of high-level signals.

It is a matter of course that a similar advantage can be obtained if a FET with a plurality of gates is used in place of the cascade FET group 35.

Ninth Embodiment

Figure 15:
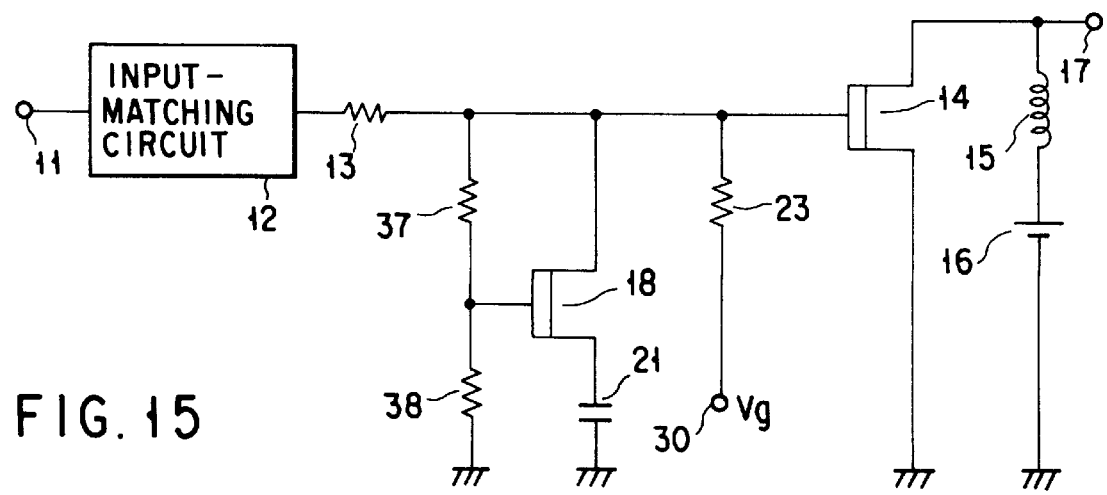
FIG. 15 is a circuit diagram, showing a high frequency amplifier according to a ninth embodiment of the invention.

FIG. 15 shows a high frequency amplifier according to a ninth embodiment of the invention. In this embodiment, the gate bias of the bypass FET 18 consists of divided resistances from voltage dividing resistors 37 and 38 which are connected between the main signal line and the ground terminal.

Tenth Embodiment

Figure 16:
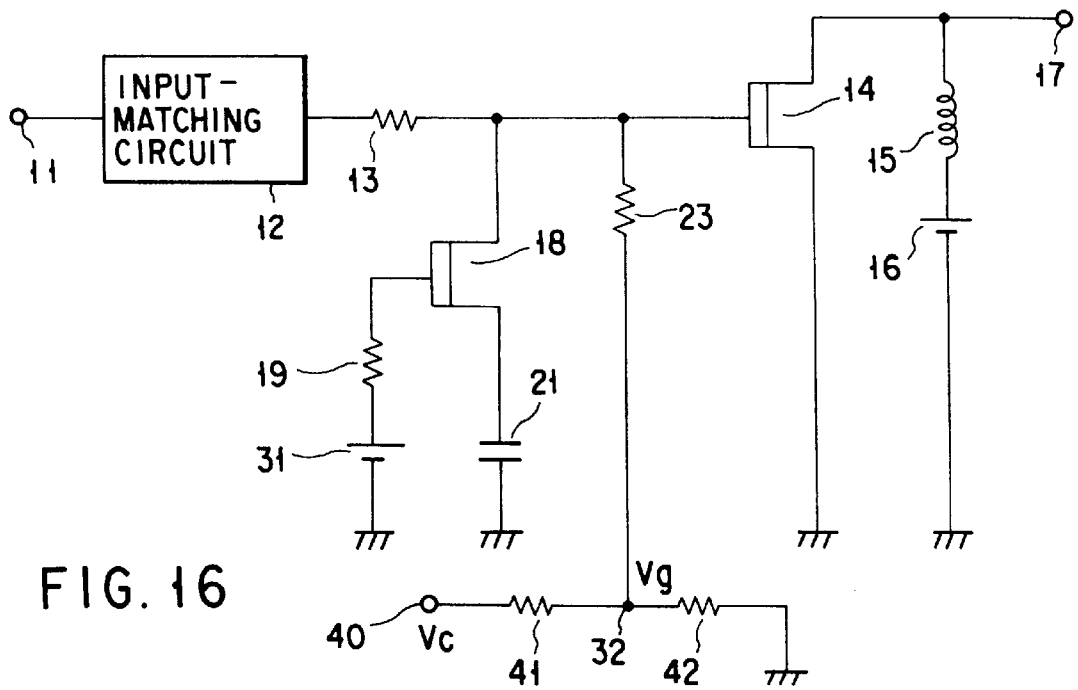
FIG. 16 is a circuit diagram, showing a high frequency amplifier according to a tenth embodiment of the invention.

FIG. 16 shows a high frequency amplifier according to a tenth embodiment of the invention. This embodiment differs from the above-described embodiments in that the junction of voltage dividing resistors 41 and 42 connected in series between a power terminal 40 and the ground terminal is used as a gain control terminal 32.

In the seventh–ninth embodiments, the degradation of the linear characteristic is minimized by operating the amplifying FET 14 and the bypass FET 18 (or the bypass cascade circuit 35) in ranges in which they produce non-distorted signals. Therefore, the variation range of the gain control voltage Vg applied to the gain control terminal 32 is limited.

On the other hand, in the tenth embodiment, the voltage Vc of the power terminal 40 is converted to the gain control voltage Vg by dividing Vc. Accordingly, Vc can consist of a negative voltage (0 V in the case of a single positive power) or a positive voltage, which means that the circuit of this embodiment has a high flexibility and puts few limitations on external circuits.

Eleventh Embodiment

Figure 17:
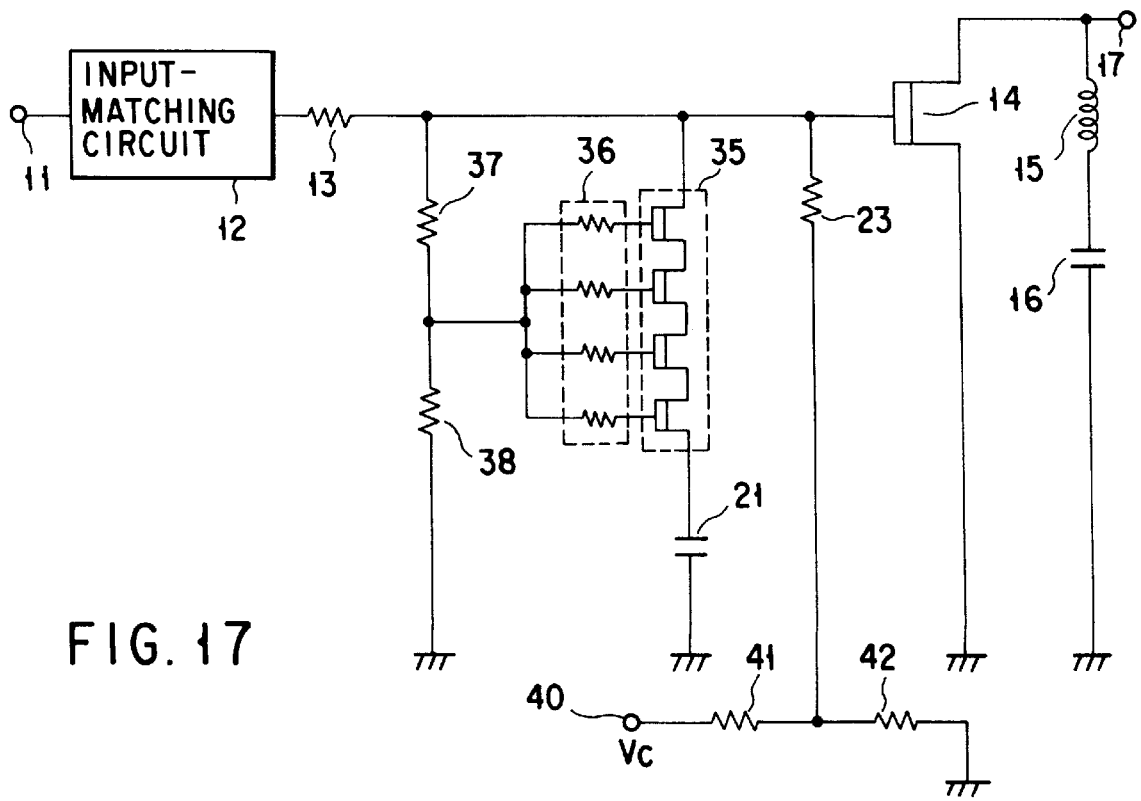
FIG. 17 is a circuit diagram, showing a high frequency amplifier according to an eleventh embodiment of the invention.

FIG. 17 shows a high frequency amplifier according to an eleventh embodiment of the invention. This embodiment is a combination of the structure of the ninth embodiment shown in FIG. 15 and that of the tenth embodiment shown in FIG. 16.

The invention is not limited to the above-described embodiments, but may be further modified in various manners. For example, although the embodiments use GaAs MESFETs as active elements, the high frequency amplifier of the invention may be formed using a compound semiconductor element such as HEMT, HBT, a CMOS transistor, or a bipolar transistor.

Furthermore, the high frequency amplifier of the invention is applicable to a voltage amplifier, a low noise amplifier, etc., as well as a power amplifier. Although the invention employs a band of 1.9 GHz for PHS as the operation frequency of the high frequency amplifier, it is not limited to this, but may be also applicable to a high frequency amplifier which deals with high frequency signals, in particular, signals of GHz bands.

As described above, since in the high frequency amplifier of the invention, the bypass FET which constitutes a variable attenuator is located on the input-side of the first-stage amplifying FET, i.e. in a position in which an input high frequency signal has a low level, a distortion component due to the non-linear characteristic of the bypass FET will not easily occur. This means that the high frequency amplifier can have an excellent linear characteristic, can be made compact by the MIC or MMIC technique, and enables a high product yield.

Further, in the invention, an impedance element such as a resistor of a high resistance interposed between the source of the bypass FET and its bias power enables the bias power to absorb low frequency noise contained in a high frequency signal and flowing into the circuit of the bias power, thereby preventing the noise from leaking into the main signal line through the bypass FET. Therefore, the amplifier is free from the increase in leakage power between adjacent channels due to a difference frequency component between the low frequency noise and the carrier frequency component.

Furthermore, the gain of the high frequency amplifier can be controlled by simultaneously controlling the gate potential of the first-stage amplifying FET and the drain potential of the bypass FET, thereby simultaneously varying the attenuation amount of the bypass FET and the gain of the amplifying FET. Thus, degradation of the linear characteristic of the high frequency amplifier in relation to a change in its gain can be further decreased. Also, the consumption power can be reduced by reducing the gate-source voltage of the amplifying FET during attenuation by the bypass FET.

In addition, a change in the input impedance of the high frequency amplifier due to a change in the bypass amount of the bypass FET can be minimized to thereby set the input VSWR at an appropriate value, for example, not more than 2, by interposing, between the gate of the first-stage amplifying FET and the input terminal for inputting a high frequency signal, an input matching circuit which opens in a DC manner when viewed from the output side, and setting the loss of the input matching circuit at a relatively high value or interposing a resistor between the output side of the input matching circuit and the drain of the bypass FET.

Additional advantages and modifications will readily occur to those skilled in the art. Therefore, the intention in its broader aspects is not limited to the specific details and representative embodiments shown and described herein. Accordingly, various modifications may be made without departing from the spirit or scope of the general inventive concept as defined by the appended claims and their equivalents.

We claim:

1. A high frequency amplifier comprising:

an amplifying FET for amplifying a high frequency signal; and a variable attenuator, connected parallel to the amplifying FET, for independently controlling an amplification factor of the amplifying FET, wherein the variable attenuator is connected between an output terminal of an input matching circuit to which a high frequency input signal is first input and a gate of the amplifier FET.

2. A high frequency amplifier according to claim 1, wherein the attenuator includes:

a bypass FET having a drain connected to a gate of the amplifying FET and a source connected to a bias power source; and control means for controlling a gate potential of the bypass FET.

3. A high frequency amplifier according to claim 2, further comprising a capacitor having an end connected to the drain of the bypass FET and the other end connected to the gate of the amplifying FET.

4. A high frequency amplifier according to claim 2, further comprising an impedance element having an end connected to the source of the bypass FET and the other end connected to the bias power source.

5. A high frequency amplifier according to claim 2, further comprising an impedance element having an end connected to the gate of the amplifying FET and the other end connected to the bias power source.

6. A high frequency amplifier according to claim 2, further comprising an impedance element having an end connected to the drain of the amplifying FET and the other end connected to another bias power source.

7. A high frequency amplifier according to claim 2, wherein the input matching circuit opens in a DC manner when viewed from an output side of the input matching circuit.

8. A high frequency amplifier according to claim 7, further comprising a resistor, interposed between the input matching circuit and the drain of the bypass FET, for suppressing impedance change of the amplifying FET.

9. A high frequency amplifier according to claim 1, wherein the attenuator includes:

a bypass FET having a drain connected to a gate of the amplifying FET and a source connected to a bias power source; and control means for controlling the gate potential of the amplifying FET and a drain-source voltage of the bypass FET.

10. A high frequency amplifier according to claim 9, further comprising an impedance element having an end connected to a source of the bypass FET and the other end connected to the bias power source.

11. A high frequency amplifier according to claim 9, further comprising an impedance element having an end connected to the gate of the amplifying FET and the other end connected to the control means.

12. A high frequency amplifier according to claim 9, further comprising an impedance element having an end connected to the drain of the amplifying FET and the other end connected to another bias power source.

13. A high frequency amplifier according to claim 9, wherein the input matching circuit opens in a DC manner when viewed from an output side of the input matching circuit.

14. A high frequency amplifier according to claim 13, further comprising a resistor interposed between the input matching circuit and the drain of the bypass FET.

15. A high frequency amplifier according to claim 9, further comprising a circuit connected to the source of the amplifying FET and consisting of a capacitor and a resistor which are connected in parallel to each other.

16. A high frequency amplifier according to claim 9, wherein the bypass FET comprises FETs connected in cascade.

17. A high frequency amplifier according to claim 9, wherein the control means includes:

voltage supply means for supplying a voltage for controlling the gate potential of the amplifying FET; and resistors for dividing a voltage supplied from the voltage supply means.

18. A high frequency amplifier comprising:

an amplifying FET for amplifying a high frequency signal;

a variable attenuator, connected parallel to the amplifying FET, for independently controlling an amplification factor of the amplifying FET, wherein the variable attenuator is connected between an output terminal of an input matching circuit to which a high frequency input signal is first input and a gate of the amplifier FET;

a resistor, interposed between the output terminal of the input matching circuit and the variable attenuator, for suppressing impedance change of the amplifying FET.

19. A high frequency amplifier comprising:

first to nth amplifying FETs for amplifying a high frequency signal, wherein the high frequency signal is first input to the first amplifying FET of the first to nth amplifying FETs and the second to nth amplifying FETs amplify the high frequency signal output from the first amplifying FET in order; and a variable attenuator, connected parallel to the first amplifying FET, for independently controlling an amplification factor of the first amplifying FET, wherein the variable attenuator is connected to a gate of the first amplifier FET.

20. A high frequency amplifier comprising:

first to nth amplifying FETs for amplifying a high frequency signal, wherein the high frequency signal is first input to the first amplifying FET of the first to nth amplifying FETs and the second to nth amplifying FETs amplify the high frequency signal output from the first amplifying FET in order;

a variable attenuator, connected parallel to the first amplifying FET, for independently controlling an amplification factor of the first amplifying FET, wherein the variable attenuator is connected to a gate of the first amplifier FET; and a resistor, interposed between an output terminal of an input matching circuit and the variable attenuator, for suppressing impedance change of the amplifying FET.

21. A high frequency amplifier comprising:

an input matching circuit configured to input a high frequency signal;

an amplifying FET configured to amplify the high frequency signal; and a variable attenuator connected parallel to the amplifying FET, and configured to independently control an amplification factor of said amplifying FET, wherein the variable attenuator is connected between an output terminal of said input matching circuit and a gate of said amplifying FET.

* * * * *